(12) United States Patent
Kaneko et al.

(10) Patent No.: US 9,313,904 B2
(45) Date of Patent: Apr. 12, 2016

(54) WIRING BOARD AND METHOD OF MANUFACTURING WIRING BOARD

(71) Applicant: SHINKO ELECTRIC INDUSTRIES CO., LTD., Nagano-ken (JP)

(72) Inventors: Kentaro Kaneko, Nagano (JP); Katsuya Fukase, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 28 days.

(21) Appl. No.: 14/310,076

(22) Filed: Jun. 20, 2014

(65) Prior Publication Data

US 2015/0008020 A1   Jan. 8, 2015

(30) Foreign Application Priority Data

Jul. 3, 2013   (JP) .................................. 2013-139658

(51) Int. Cl.
*H05K 1/09* (2006.01)
*H05K 3/46* (2006.01)

(52) U.S. Cl.
CPC .............. *H05K 3/465* (2013.01); *H05K 3/4679* (2013.01); *H05K 2201/09527* (2013.01); *H05K 2203/025* (2013.01)

(58) Field of Classification Search
CPC ............. H05K 1/00; H05K 1/02; H05K 1/09; H05K 1/11; H05K 3/10; H05K 3/28; H05K 3/38; H05K 3/46; H01L 21/02; H01L 21/48; H01L 23/18; H01L 23/24; H01L 23/38; H01L 23/48; H01L 23/498; H01L 29/94

USPC ......... 174/257, 250, 251, 255, 256, 258–264, 174/266; 257/306, 670; 428/139, 206, 209, 428/606, 626

See application file for complete search history.

(56) References Cited

U.S. PATENT DOCUMENTS

| | | | | |
|---|---|---|---|---|
| 5,569,545 A | * | 10/1996 | Yokono et al. | 428/626 |
| 6,217,987 B1 | * | 4/2001 | Ono et al. | 428/209 |
| 6,248,428 B1 | * | 6/2001 | Asai et al. | 428/206 |
| 6,261,671 B1 | * | 7/2001 | Asai et al. | 428/206 |
| 6,534,723 B1 | * | 3/2003 | Asai et al. | 174/255 |
| 6,828,510 B1 | * | 12/2004 | Asai et al. | 174/255 |
| 6,930,258 B1 | * | 8/2005 | Kawasaki et al. | 174/264 |
| 2001/0037896 A1 | * | 11/2001 | Asai et al. | 174/255 |
| 2002/0182433 A1 | * | 12/2002 | Endo | 428/606 |
| 2003/0132025 A1 | * | 7/2003 | Wakihara et al. | 174/256 |
| 2004/0134682 A1 | * | 7/2004 | En et al. | 174/258 |
| 2005/0258522 A1 | * | 11/2005 | En et al. | 257/670 |
| 2007/0169886 A1 | * | 7/2007 | Watanabe et al. | 156/325 |

(Continued)

FOREIGN PATENT DOCUMENTS

JP   2012-235166   11/2012

*Primary Examiner* — Xiaoliang Chen
(74) *Attorney, Agent, or Firm* — Fish & Richardson P.C.

(57) ABSTRACT

A wiring board includes a first wiring layer including a first conductive layer and a second conductive layer coating a first surface and a side surface of the first conductive layer. A first insulating layer covers a first surface and a side surface of the second conductive layer so as to expose a second surface of the first conductive layer opposite to the first surface of the first conductive layer. A second wiring layer is stacked on a first surface of the first insulating layer and is electrically connected to the first wiring layer. The first surface and the side surface of the first conductive layer are smooth surfaces while the first surface and the side surface of the second conductive layer are roughened-surfaces.

6 Claims, 8 Drawing Sheets

(56) References Cited

U.S. PATENT DOCUMENTS

| | | | |
|---|---|---|---|
| 2007/0181928 A1* | 8/2007 | Yamanishi et al. | 257/306 |
| 2010/0071940 A1* | 3/2010 | Ejiri et al. | 174/257 |
| 2011/0155438 A1* | 6/2011 | Ito et al. | 174/261 |
| 2011/0198114 A1* | 8/2011 | Maeda et al. | 174/257 |
| 2011/0200788 A1* | 8/2011 | Maeda et al. | 428/139 |
| 2011/0284269 A1* | 11/2011 | Maeda et al. | 174/251 |
| 2011/0284277 A1* | 11/2011 | Kato | 174/258 |
| 2012/0103667 A1* | 5/2012 | Ito et al. | 174/257 |

* cited by examiner

WIRING BOARD AND METHOD OF MANUFACTURING WIRING BOARD

CROSS-REFERENCE TO RELATED APPLICATIONS

This application is based upon and claims the benefit of priority from prior Japanese Patent Application No. 2013-139658, filed on Jul. 3, 2013, the entire contents of which are incorporated herein by reference.

FIELD

The present disclosure relates to a wiring board.

BACKGROUND

Densification of semiconductor chips to be mounted has been advanced, and hence wiring boards have been required to be thinned, and wiring patterns have been required to be highly densified. To meet these requirements, a so-called coreless board, which is a wiring board from which a core board (supporting member) having high rigidity and thicker than an interlayer insulating film is removed, is proposed (see Japanese Laid-open Patent Application No. 2012-235166, for example). Thus the formed coreless board is manufactured according to, for example, the following manufacturing method.

Figure 9A:
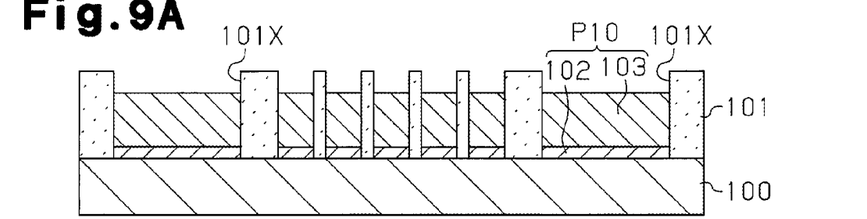
FIG. 9A to FIG. 9E are schematic cross-sectional views to describe a manufacturing method of a conventional wiring board.
Figure 9B:
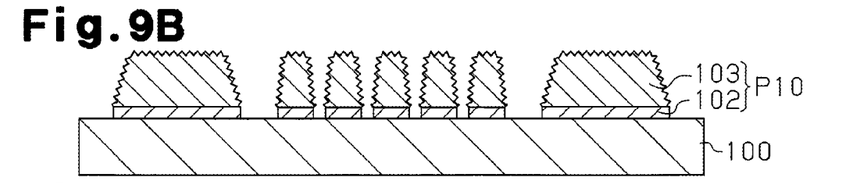
Figure 9C:
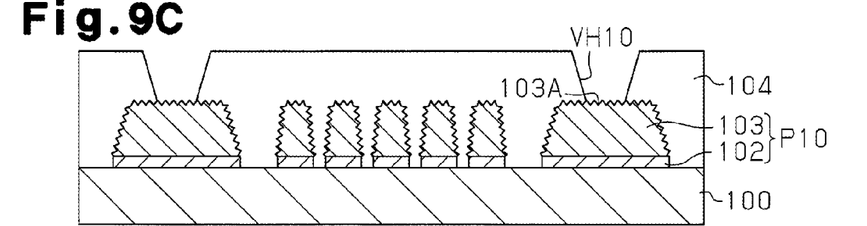
Figure 9D:
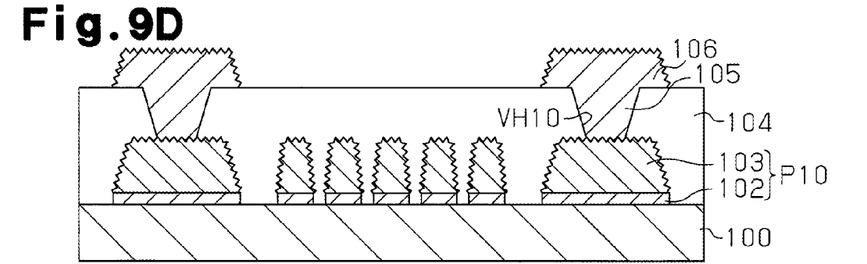
Figure 9E:
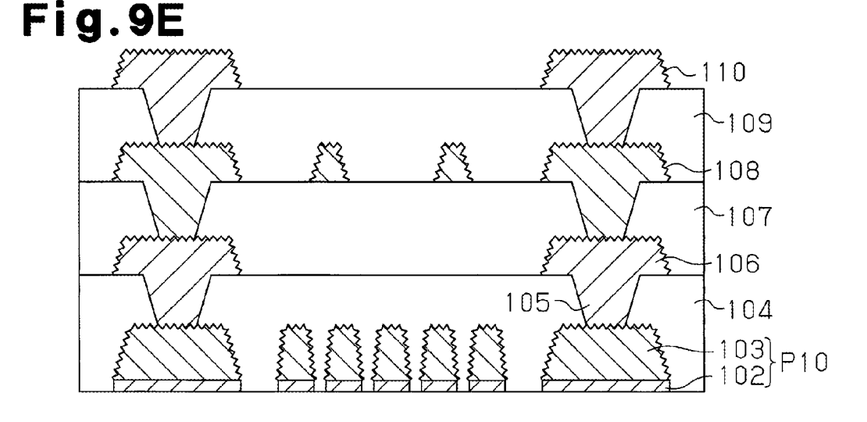

First, as shown in FIG. 9A, a support substrate 100 is prepared, and a resist layer 101 is formed on the support substrate 100. The resist layer 101 has an opening portion 101X to form a pad P10. The pad P10 including a plating layer (e.g., gold layer/nickel layer) 102 and a wiring layer 103 is formed on the support substrate 100 in the opening portion 101X. Thereafter, at the step of FIG. 9B, the resist layer 101 is removed, and the surface of the wiring layer 103 is subjected to roughening treatment. As a result, the surface of the wiring layer 103 is roughened. Thereafter, at the step of FIG. 9C, an insulating layer 104 is stacked on the support substrate 100 so as to cover the pad P10, and a via hole VH10 that reaches an upper surface 103A of the wiring layer 103 is formed in the insulating layer 104. Thereafter, at the step of FIG. 9D, a via wiring 105 with which the via hole VH10 is filled is formed, and a wiring pattern 106 that is connected to the pad P10 (wiring layer 103) through the via wiring 105 is stacked on the insulating layer 104. Thereafter, as shown in FIG. 9E, insulating layers 107 and 109 and build-up wiring layers 108 and 110 are alternately stacked on the insulating layer 104, and, finally, the support substrate 100 of FIG. 9D is removed.

SUMMARY

In the aforementioned manufacturing method, roughening treatment is applied onto the surface of the wiring layer 103 formed on the support substrate 100, and then the insulating layer 104 is stacked on the support substrate 100 so as to coat the wiring layer 103. As a result, adhesion between the insulating layer 104 and the wiring layer 103 is heightened. However, the roughening treatment causes the width of the wiring layer 103 to become smaller than before the roughening treatment is applied thereonto. In order to obtain a desired wiring width, the width of the wiring layer 103, which has not yet undergone roughening treatment, is required to be formed widely in consideration of a width amount reduced by roughening treatment. If so, the width of the resist layer 101 shown in FIG. 9A must be make smaller, and therefore problems, such as fall-down of the resist layer 101, will be liable to occur more easily in proportion to a decrease in the width of the wiring layer 103. Therefore it becomes difficult to deal with the reduction of the wiring layer 103 in size.

One aspect of the present disclosure is a wiring board including a first wiring layer that includes a first conductive layer and a second conductive layer, the second conductive layer coating a first surface of the first conductive layer and a side surface of the first conductive layer, the first conductive layer and the second conductive layer being respectively made of a first conductive material and a second conductive material differing from the first conductive material. A first insulating layer is an outermost layer of the wiring board and coats a first surface of the second conductive layer and a side surface of the second conductive layer so as to expose a second surface of the first conductive layer which is opposite to the first surface of the first conductive layer. A second wiring layer is stacked on a first surface of the first insulating layer and is electrically connected to the first wiring layer. The first surface and the side surface of the first conductive layer are smooth surfaces while the first surface and the side surface of the second conductive layer are roughened-surfaces.

Other aspects and advantages of the present invention will become apparent from the following description, taken in conjunction with the accompanying drawings, illustrating by way of example the principles of the invention.

BRIEF DESCRIPTION OF DRAWINGS

The invention, together with objects and advantages thereof, may best be understood by reference to the following description of the presently preferred embodiments together with the accompanying drawings in which.

DETAILED DESCRIPTION OF EMBODIMENTS

In the drawings, elements are illustrated for simplicity and clarity and have not necessarily been drawn to scale. To facilitate understanding, hatching lines may not be illustrated in the cross-sectional drawings and screentones may be used instead.

An embodiment will be hereinafter described with reference to the accompanying drawings.

First, a structure of a wiring board 1 will be described.

Figure 1:
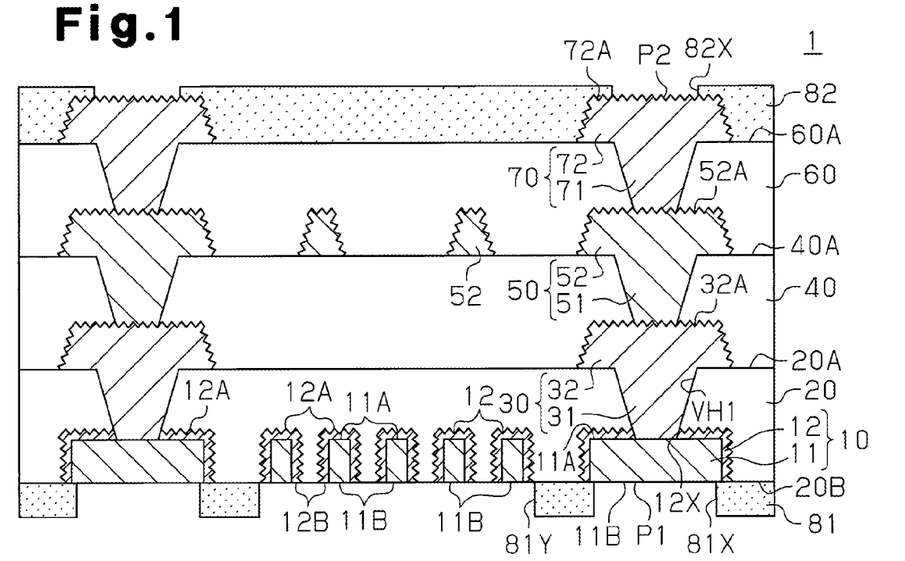
FIG. 1 is a schematic cross-sectional view showing a wiring board of one embodiment.

As shown in FIG. 1, the wiring board 1 has a structure in which a wiring layer 10, a first insulating layer 20, a second wiring layer 30, an insulating layer 40, a wiring layer 50, an insulating layer 60, and a wiring layer 70 are stacked in this order. The wiring board 1 differs from a wiring board produced by a generally-known build-up process (in which a predetermined number of build-up layers are formed one by one and are stacked on both surfaces or on one surface of a core board serving as a support substrate), and has the form of a so-called "coreless board" that does not include a support substrate.

The material of the second wiring layers 30, 50, and 70 may be, for example, copper (Cu) or a copper alloy. The material of the first insulating layers 20, 40, and 60 may be, for example, insulating resin, such as epoxy resin or polyimide resin, or may be, for example, a resin material made by mixing a filler, such as silica or alumina, with the aforementioned resin. The material of the first insulating layers 20, 40, and 60 may be insulating resin that has thermosetting properties or insulating resin that has photosensitivity. The material of the first insulating layers 20, 40, and 60 may be, for example, reinforced insulating resin made by impregnating epoxy-based or polyimide-based thermosetting resin into a reinforcement material, such as a woven fabric or nonwoven fabric made of glass, aramid, or LCP (Liquid Crystal Polymer) fiber.

The wiring layer 10 is formed at the outermost layer (herein, lowermost layer) of the wiring board 1. The wiring layer 10 has a first conductive layer 11 and a second conductive layer 12. The material of the first conductive layer 11 may be, for example, copper or a copper alloy. The material of the second conductive layer 12 may be a conductive material that differs from that of the first conductive layer 11. Preferably, the material of the second conductive layer 12 is a conductive material selectively etched and removed from the first conductive layer 11. Preferably, the material of the second conductive layer 12 is a conductive material that is higher in resistivity than that of the first conductive layer 11. The material of the second conductive layer 12 may be a metal, such as nickel (Ni), chromium (Cr), tin (Sn), cobalt (Co), iron (Fe), or palladium (Pd), or may be an alloy containing at least one kind of metal selected from these metals.

The first conductive layer 11 is formed in a substantially rectangular shape in cross sectional view. The first conductive layer 11 has a first surface 11A (herein, upper surface), a second surface 11B (herein, lower surface), and a side surface. The surfaces (first surface 11A, second surface 11B, and side surface) of the first conductive layer 11 are smooth surfaces (low-roughness surfaces) that are less rugged. For example, the surface roughness Ra of the surface of the first conductive layer 11 is set to be less than 0.1 μm. The surface roughness Ra is also called arithmetic mean roughness. The surface roughness Ra is calculated by measuring, in a plurality of measurement positions within a measurement area of a certain size, a height from a mean surface (or average level) within the measurement area and arithmetically averaging absolute values of measured heights. The surface of the first conductive layer 11 is glossy or semi-glossy. The roughness of the second surface 11B of the first conductive layer 11 may be set to be higher than that of the first surface 11A and that of the side surface of the first conductive layer 11. In other words, the surface roughness Ra of the second surface 11B of the first conductive layer 11 may be set to be 0.1 μm or more.

The second surface 11B (herein, lower surface) of the first conductive layer 11 is exposed from the first insulating layer 20. In this example, the second surface 11B of the first conductive layer 11 is formed to be substantially flush with the second surface 20B (herein, lower surface) of the first insulating layer 20.

The second conductive layer 12 is formed so as to coat the first surface 11A and the side surface of the first conductive layer 11. In the present example, the second conductive layer 12 coats the whole of the side surface of the first conductive layer 11, and coats a part of the first surface 11A of the first conductive layer 11. In other words, in the present example, the second conductive layer 12 is formed so as to expose a part of the first surface 11A of the first conductive layer 11. In other words, the second conductive layer 12 has an opening portion 12X that passes through the second conductive layer 12 from the first surface 12A (herein, upper surface) and by which a part of the first surface 11A of the first conductive layer 11 is exposed.

The second surface 12B (herein, lower surface) of the second conductive layer 12 is exposed from the first insulating layer 20. In the present example, the second surface 12B of the second conductive layer 12 is formed to be substantially flush with the second surface 20B of the first insulating layer 20 and with the second surface 11B of the first conductive layer 11.

On the other hand, the first surface 12A and the side surface of the second conductive layer 12 are roughened-surfaces. For example, the first surface 12A and the side surface of the second conductive layer 12 are higher in roughness than the first surface 11A and the side surface of the first conductive layer 11. For example, the first surface 12A and the side surface of the second conductive layer 12 are higher in roughness than the second surface 12B of the second conductive layer 12. For example, the surface roughness Ra of the first surface 12A and the surface roughness Ra of the side surface of the second conductive layer 12 are set to be about 0.2 μm to about 0.4 μm.

The thus formed wiring layer 10 is a wiring layer formed more finely than a wiring layer 70 formed at the outermost layer (herein, uppermost layer) on the opposite side with respect to the wiring layer 10. For example, the wiring layer 10 is a fine wiring whose line/space (L/S) is less than 5 μm/5 μm. The thickness of the wiring layer 10 may be, for example, about 6 μm to about 15 μm. The thickness of the first conductive layer 11 may be, for example, about 5 μm to about 10 μm. The thickness of the second conductive layer 12 may be, for example, about 0.1 μm to about 1 μm.

The first insulating layer 20 is formed so as to coat the first surface 12A and the side surface of the second conductive layer 12, and is formed so as to expose the second surface 11B of the first conductive layer 11 and so as to expose the second surface 12B of the second conductive layer 12. The first insulating layer 20 has a via hole VH1 that passes through the first insulating layer 20 from the first surface 20A (herein, upper surface) and by which a part of the first surface (herein, upper surface) of the wiring layer 10 is exposed. The via hole VH1 is communicated with the opening portion 12X of the second conductive layer 12. In the present example, the first insulating layer 20 is formed so as to expose the first surface 11A of the first conductive layer 11 that has been exposed from the opening portion 12X of the second conductive layer 12. The thickness from the first surface 12A of the second conductive layer 12 to the first surface 20A of the first insulating layer 20 may be about 10 μm to about 30 μm.

The second wiring layer 30 is stacked on the first insulating layer 20. The second wiring layer 30 has a via wiring 31 with which the opening portion 12X and the via hole VH1 are filled and a wiring pattern 32 that is stacked on the first surface 20A of the first insulating layer 20 and that is electrically connected to the wiring layer 10 through the via wiring 31.

The via wiring 31 is connected to the first conductive layer 11 exposed to a bottom of the opening portion 12X. In the opening portion 12X, the via wiring 31 is connected to the second conductive layer 12 that makes up the side wall of the opening portion 12X. The via hole VH1 and the via wiring 31 with which the via hole VH1 is filled are each formed in a tapered shape in which its diameter becomes greater in proportion to an approach from the lower side (the wiring layer side (10)) to the upper side (the wiring pattern side (32)) in FIG. 1. In other words, the via hole VH1 and the via wiring 31 are each formed in a substantially inverted trapezoidal shape in cross sectional view. The planar shape of the via wiring 31 may be, for example, a circle, and its diameter may be, for example, about 30 µm to about 75 µm. For example, in the present example, the via wiring 31 is formed in a truncated cone shape in which the lower surface connected to the first conductive layer 11 is smaller in diameter than the upper surface connected to the wiring pattern 32.

The wiring pattern 32 is formed in a substantially trapezoidal shape in cross sectional view. The first surface 32A and the side surface of the wiring pattern 32 are roughened-surfaces. For example, the first surface 32A and the side surface of the wiring pattern 32 are higher in roughness than the first surface 11A and the side surface of the first conductive layer 11. For example, the surface roughness Ra of the first surface 32A and the surface roughness Ra of the side surface of the wiring pattern 32 are set to be about 0.2 µm to about 2.0 µm. The thickness of the wiring pattern 32 may be, for example, about 5 µm to about 20 µm.

Likewise, the insulating layer 40 is stacked on the first surface 20A of the first insulating layer 20 so as to coat the first surface 32A and the side surface (roughened surface) of the wiring pattern 32. The wiring layer 50 is stacked on the insulating layer 40. The wiring layer 50 has a via wiring 51 that passes through the insulating layer 40 in the thickness direction and a wiring pattern 52 that is stacked on the insulating layer 40 and that is electrically connected to the wiring pattern 32 through the via wiring 51.

The insulating layer 60 is stacked on the insulating layer 40 so as to coat the first surface 52A and the side surface of the wiring pattern 52. The wiring layer 70 is stacked on the insulating layer 60. The wiring layer 70 has a via wiring 71 that passes through the insulating layer 60 in the thickness direction and a wiring pattern 72 that is stacked on the insulating layer 60 and that is electrically connected to the wiring pattern 52 through the via wiring 71.

Herein, the via wiring lines 51 and 71 are each formed in a tapered shape in which its diameter becomes greater in proportion to an approach from the lower side (the wiring layer side (10)) to the upper side (the wiring pattern side (72)) in FIG. 1. The planar shape of each of the via wiring lines 51 and 71 may be, for example, a circle, and its diameter may be, for example, about 30 µm to about 75 µm. The first surface 52A and the side surface of the wiring pattern 52 and the first surface 72A and the side surface of the wiring pattern 72 are roughened-surfaces, in the same way as the first surface 32A and the side surface of the wiring pattern 32. The thickness of each of the wiring patterns 52 and 72 may be, for example, about 5 µm to about 20 µm. The thickness of the wiring pattern 32 from the first surface 32A to the first surface 40A (herein, upper surface) of the insulating layer 40 and the thickness of the wiring pattern 52 from the first surface 52A to the first surface 60A (herein, upper surface) of the insulating layer 60 may be each, for example, about 10 µm to about 30 µm.

A solder resist layer 81 is stacked on the second surface 20B of the first insulating layer 20 serving as an outermost layer (herein, as a lowermost layer). The material of the solder resist layer 81 may be, for example, insulating resin, such as epoxy resin or acrylic resin. The solder resist layer 81 has an opening portion 81X by which at least one part of the wiring layer 10 that is the lowermost layer is exposed in the form of a pad P1. In the present example, the solder resist layer 81 has an opening portion 81X by which a part of the second surface 11B of the first conductive layer 11 in the wiring layer 10 is exposed in the form of a pad P1. A bump 4 of a semiconductor chip 3 (see FIG. 2) is bonded to the pad P1 according to a flip-chip method. In other words, the surface on which the pad P1 is formed serves as a chip-mounting surface.

If needed, an OSP (Organic Solderability Preservative) film may be formed by applying OSP treatment onto the wiring layer 10 exposed from the opening portion 81X, and the semiconductor chip 3 may be connected to the OSP film. Alternatively, a metallic layer may be formed on the wiring layer 10 exposed from the opening portion 81X, and the semiconductor chip 3 may be connected to the metallic layer. This metallic layer may be, for example, a gold (Au) layer, or an Ni layer/Au layer (i.e., a metallic layer made by stacking an Ni layer and an Au layer on the wiring layer 10 in this order), or an Ni layer/Pd layer/Au layer (i.e., a metallic layer made by stacking an Ni layer, a Pd layer, and an Au layer on the wiring layer 10 in this order). The Ni layer, the Au layer, and the Pd layer may be, for example, metallic layers (electroless plating metallic layers) formed by an electroless plating method. The Au layer is a metallic layer made of Au or an Au alloy, and the Ni layer is a metallic layer made of Ni or an Ni alloy, and the Pd layer is a metallic layer made of Pd or a Pd alloy.

The solder resist layer 81 has an opening portion 81Y by which the second surface 11B of the first conductive layer 11 and the second surface 12B of the second conductive layer 12 are exposed in some of the plurality of wiring layers 10.

On the other hand, a solder resist layer 82 is stacked on the first surface 60A (herein, upper surface) of the insulating layer 60 that is an outermost layer (herein, uppermost layer). The material of the solder resist layer 82 may be, for example, insulating resin, such as epoxy resin or acrylic resin. The solder resist layer 82 has an opening portion 82X by which a part of the first surface 72A of the uppermost wiring pattern 72 is exposed in the form of an external connection pad P2. An external connection terminal 6 (see FIG. 2), such as a solder ball or a lead pin that is used when the wiring board 1 is mounted on a mounting substrate (e.g., a mother board), is connected to the external connection pad P2. If needed, an OSP film may be formed by applying OSP treatment onto the wiring pattern 72 exposed from the opening portion 82X, and the external connection terminal 6 may be connected to the OSP film. Alternatively, a metallic layer may be formed on the wiring pattern 72 exposed from the opening portion 82X, and the external connection terminal 6 may be connected to the metallic layer. The metallic layer may be, for example, an Au layer, or an Ni layer/Au layer (i.e., a metallic layer made by stacking an Ni layer and an Au layer on the first surface 72A of the wiring pattern 72 in this order), or an Ni layer/Pd layer/Au layer (i.e., a metallic layer made by stacking an Ni layer, a Pd layer, and an Au layer on the first surface 72A of the wiring pattern 72 in this order). The wiring pattern 72 itself exposed from the opening portion 82X (alternatively, an OSP film or a metallic layer if this OSP film or this metallic layer is formed on the wiring pattern 72) may be allowed to function as an external connection terminal.

Figure 2:
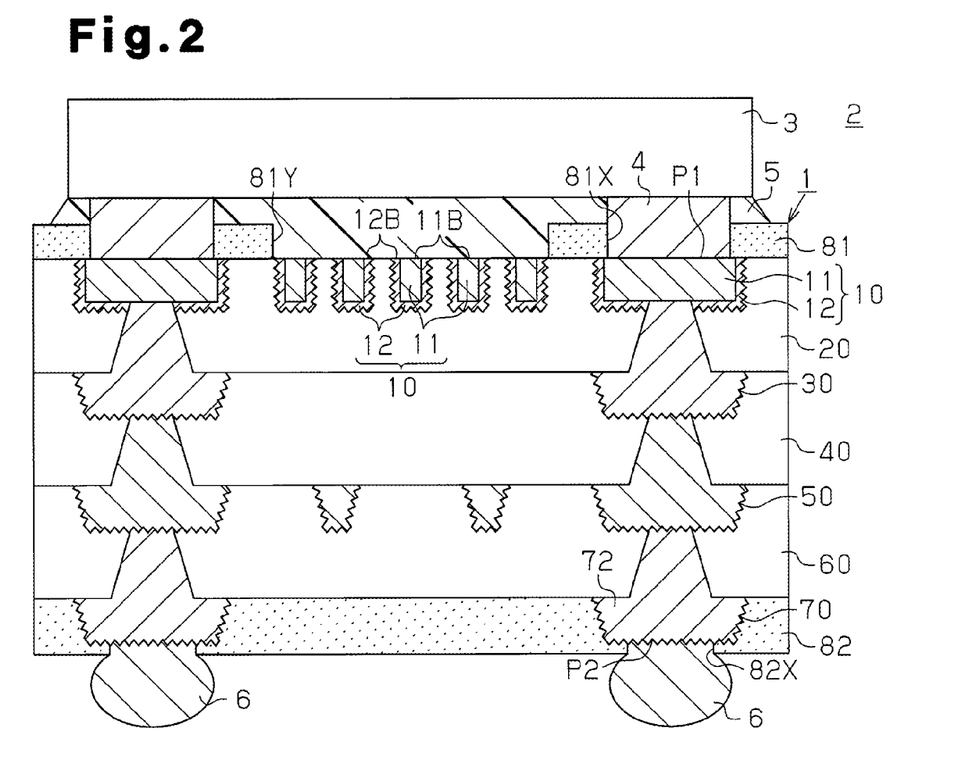
FIG. 2 is a schematic cross-sectional view showing a semiconductor device of FIG. 1.

Next, a structure of the semiconductor device 2 will be described with reference to FIG. 2. In FIG. 2, the wiring board 1 is depicted so as to reverse the top and bottom of the wiring board 1 of FIG. 1.

As shown in FIG. 2, the semiconductor device 2 has the wiring board 1, the semiconductor chip 3, and an underfill resin 5.

The semiconductor chip 3 is mounted on the wiring board 1 in a flip-chip manner. In other words, the bump 4 formed on a circuit-forming surface (in FIG. 2, lower surface) of the semiconductor chip 3 is bonded to the pad P1 of the wiring board 1, and, as a result, the semiconductor chip 3 is electrically connected to the wiring layer 10 of the wiring board 1 through the bump 4.

The semiconductor chip 3 may be, for example, a logic chip, such as a CPU (Central Processing Unit) chip or a GPU (Graphics Processing Unit) chip, or may be, for example, a memory chip, such as a DRAM (Dynamic Random Access Memory) chip, a SRAM (Static Random Access Memory) chip, or a flash memory chip. The size of the semiconductor chip 3 may be, for example, about 3 mm×3 mm to 12 mm×12 mm in plan view. The thickness of the semiconductor chip 3 may be, for example, about 50 µm to about 100 µm.

The bump 4 may be, for example, a gold bump or a solder bump. The material of the solder bump may be, for example, an alloy containing Pb (lead), an alloy consisting of Sn and Au, an alloy consisting of Sn and Cu, an alloy consisting of Sn and Ag (silver), or an alloy consisting of Sn, Ag, and Cu.

The underfill resin 5 is formed so as to fill a gap between the wiring board 1 and the semiconductor chip 3. The wiring layer 10 exposed from the opening portion 81Y of the solder resist layer 81 is coated with this underfill resin 5. The material of the underfill resin 5 may be, for example, insulating resin such as epoxy resin.

Next, an operation of the wiring board 1 and an operation of the semiconductor device 2 will be described.

The wiring board 1 has the wiring layer 10 and the first insulating layer 20. The wiring layer 10, which is an outermost layer, includes the first conductive layer 11 and the second conductive layer 12 with which the first surface 11A and the side surface of the first conductive layer 11 are coated and that has the first surface 12A and its side surface that are roughened-surfaces. The first insulating layer 20, which is an outermost layer, coats the first surface 12A and the side surface of the second conductive layer 12. In other words, the second conductive layer 12 that has the first surface 12A and the side surface both of which are roughened-surfaces is interposed between the first conductive layer 11 and the first insulating layer 20. According to this structure, the first surface 12A and the side surface of the second conductive layer 12 that are contiguous to the first insulating layer 20 become roughened surfaces, and therefore it is possible to increase the contact area between the second conductive layer 12 (wiring layer 10) and the first insulating layer 20 even if the first surface 11A and the side surface of the first conductive layer 11 are smooth surfaces. It is possible to heighten adhesion between the second conductive layer 12 (wiring layer 10) and the first insulating layer 20. In other words, it is possible to satisfactorily secure an adhesive force with the first insulating layer 20 by means of the second conductive layer 12 having the first surface 12A and its side surface that are roughened-surfaces even if the first surface 11A and the side surface of the first conductive layer 11 are smooth surfaces. There is no need to apply roughening treatment onto the first surface 11A and the side surface of the first conductive layer 11. Therefore it is possible to suitably restrain the first conductive layer 11 from becoming small in width and from becoming small in thickness. In some embodiments, the second conductive layer 12 may be referred to as a coating film that protects the first conductive layer from being etched and enhances bonding strength between the first conductive layer and the first insulating layer.

Next, a manufacturing method of the wiring board 1 will be described.

Figure 3A:
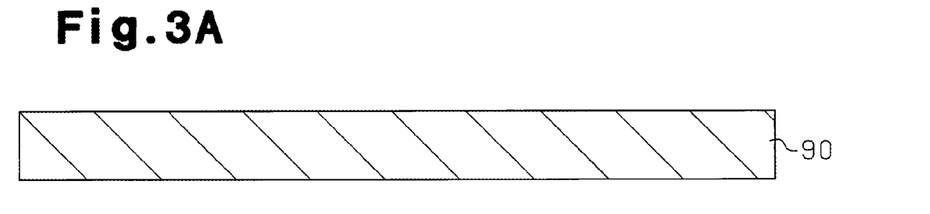
FIGS. 3A to 3E are schematic cross-sectional views to describe a manufacturing method of a wiring board of FIG. 1.

First, as shown in FIG. 3A, a support substrate 90 is prepared to manufacture the wiring board 1. Although the support substrate 90 shown in FIG. 3A in the present example is a copper foil, the support substrate 90 may be a metallic foil or a metallic plate other than the copper foil. The thickness of the support substrate 90 may be, for example, about 35 µm to about 100 µm.

Figure 3B:
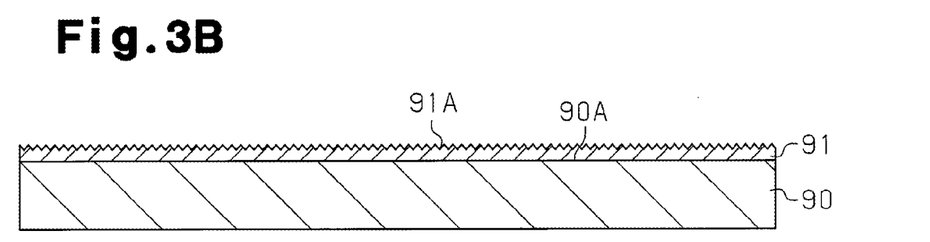

Thereafter, at the step of FIG. 3B, a first metal film 91 whose first surface 91A is a roughened surface is formed on a first surface 90A (herein, upper surface) of the support substrate 90. The material of the first metal film 91 may be a conductive material differing from the conductive material of the first conductive layer 11 (see FIG. 1) that is formed at a subsequent step and differing from the conductive material of the support substrate 90. Preferably, the material of the first metal film 91 is a conductive material selectively etched and removed from the first conductive layer 11. This material of the first metal film 91 may be, for example, metal, such as Ni, Cr, Sn, Co, Fe, or Pd, or may be, for example, an alloy that contains at least one kind of metal selected from these metals. Preferably, this material of the first metal film 91 is the same conductive material as the second conductive layer 12 (see FIG. 1) that is formed at the subsequent step. For example, this material is Ni. The thickness of the first metal film 91 may be, for example, about 0.1 µm to about 1.0 µm. Preferably, the surface roughness Ra of the first surface 91A (herein, upper surface) of the first metal film 91 falls within, for example, 0.2 µm to 0.4 µm. One example of a method for forming the first metal film 91 will be hereinafter described.

For example, an electrolytic plating method that uses the support substrate 90 for a plating-electric-supply layer is applied to the first surface 90A of the support substrate 90, and the first metal film 91 (surface-roughened plating layer) is formed on the first surface 90A of the support substrate 90. It should be noted that, in order to set the roughness of the first surface 91A of the first metal film 91 at the aforementioned value, it is necessary to appropriately adjust the composition of a plating solution used in the electrolytic plating method or adjust the electric current density. A description will be hereinafter given of one example of plating conditions when the first metal film 91 made of Ni is formed.

Composition of nickel chloride plating bath:
    Nickel chloride 75 g/L,
    Sodium thiocyanate 15 g/L,
    Ammonium chloride 30 g/L,
    Boron 30 g/L
Plating conditions:
    pH: about 4.5 to 5.5,
    Bath temperature: normal temperature (about 25° C.),
    Processing time: about 1 to 30 minutes,
    Cathode current density: about 1 to 3 A/dm$^2$ The composition of a plating solution, the current density, etc., to be used are appropriately pre-adjusted in this way, and, as a result, the first surface 91A of the first metal film 91 is roughened, thus making it possible to set the first surface 91A at a desired surface roughness. The aforementioned composition of the plating solution or the aforementioned plating conditions are one example, and no specific limitations are imposed on the composition or the conditions if the first surface 91A of the first metal film 91 is set at a desired roughness.

Figure 3C:
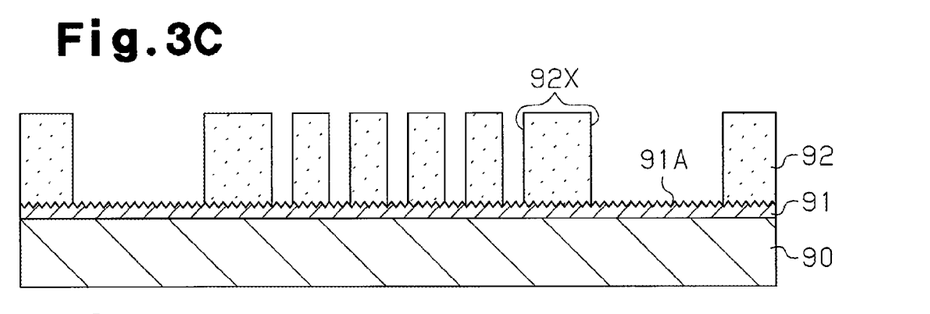

Thereafter, at the step of FIG. 3C, a resist layer 92 having an opening portion 92X is formed on the first surface 91A of the first metal film 91. The opening portion 92X is formed so as to expose the first surface 91A of the first metal film 91 that is a part corresponding to the formation region of the first conductive layer 11 of the wiring layer 10 (see FIG. 1). At this time, the first surface 91A of the first metal film 91 is a roughened surface, and therefore it is possible to obtain excellent adhesion between the first metal film 91 and the resist layer 92.

The material of the resist layer 92 may be a material that has plating resistance against plating treatment executed at the subsequent step. The material of the resist layer 92 may be a photosensitive dry film resist or a liquid photoresist (for example, dry film resist or liquid resist of novolac resin or of acrylic resin). For example, when a photosensitive dry film resist is used, a dry film is laminated onto the first surface 91A of the first metal film 91 by thermocompression bonding, and the resist layer 92 having the opening portion 92X is formed by subjecting the dry film to patterning according to a photolithography method. Likewise, when a liquid photoresist is used, the same step as above is executed, thus making it possible to form the resist layer 92.

Figure 3D:
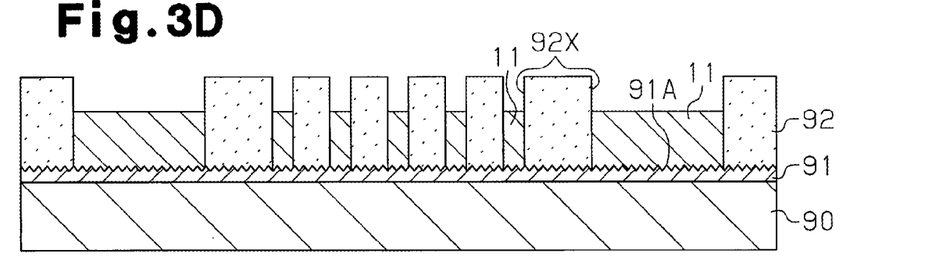

Thereafter, at the step of FIG. 3D, the first conductive layer 11 is formed on the first metal film 91 exposed from the opening portion 92X of the resist layer 92. For example, the electrolytic plating method that uses the first metal film 91 for a plating-electric-supply layer is applied to the first surface 91A of the first metal film 91 while using the resist layer 92 as a plating mask. More specifically, the first conductive layer 11 is formed on the first metal film 91 by applying electrolytic plating (herein, electrolytic copper plating) to the first surface 91A of the first metal film 91 exposed from the opening portion 92X of the resist layer 92. At this time, the first surface 11A and the side surface of the first conductive layer 11 are each formed into a less rugged, smooth surface. Preferably, herein, the surface roughness Ra of the first surface 11A of the first conductive layer 11 is less than 0.1 μm. In other words, the composition of a plating solution used in the electrolytic plating method, the current density, the thickness of the first conductive layer 11, etc., are pre-adjusted so as to have the aforementioned roughness (smooth surface). A plating solution used in the aforementioned electrolytic copper plating is a mixture made by adding organic elements, such as leveler, polymer, and brightener, each of which is used as an additive, to inorganic elements, such as copper sulfate, sulfuric acid, and chlorine.

Figure 3E:
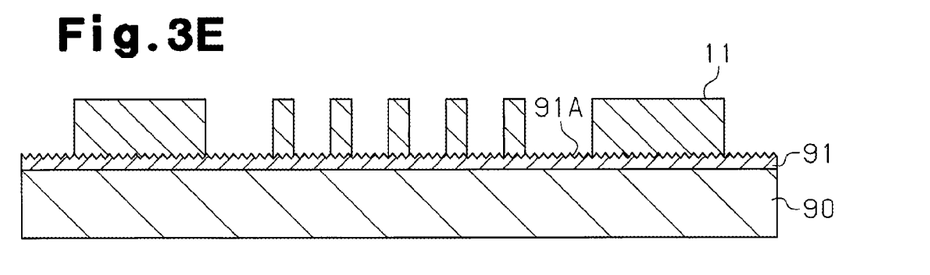

Thereafter, at the step of FIG. 3E, the resist layer 92 shown in FIG. 3D is removed by, for example, an alkaline peel-off liquid.

Figure 4A:
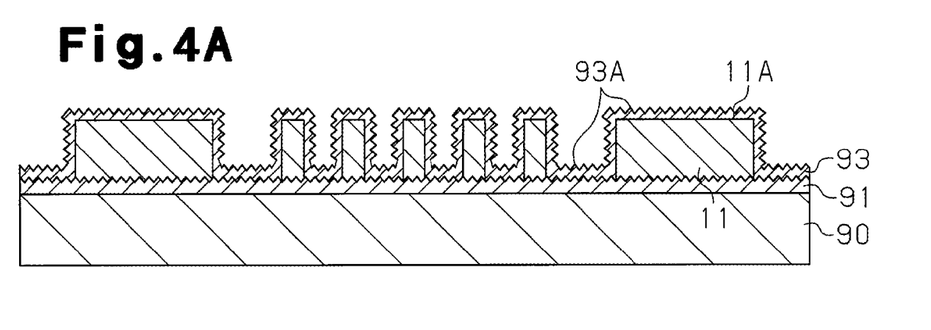
FIG. 4A, FIG. 4C, and FIG. 4D are schematic cross-sectional views to describe the manufacturing method of the wiring board of FIG. 1.
Figure 4B:
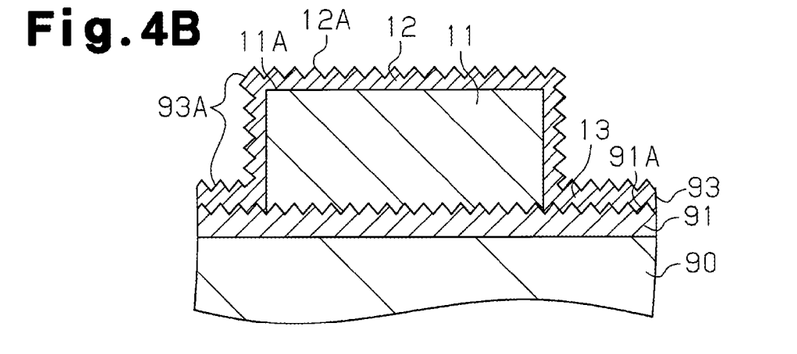
FIG. 4B is a partially enlarged cross-sectional view of a structure shown in FIG. 4A.

Thereafter, at the step of FIG. 4A, the second metal film 93 whose surface 93A is a roughened surface is formed on the first surface 91A of the first metal film 91 so as to coat the first surface 91A of the first metal film 91 and the first surface 11A and the side surface of the first conductive layer 11. As shown in FIG. 4B, the second metal film 93 of the present example includes the second conductive layer 12 with which the first surface 11A and the side surface of the first conductive layer 11 are coated and an extension portion 13 that extends from the second conductive layer 12 in the planar direction and with which the first surface 91A of the first metal film 91 formed between the adjacent first conductive layers 11 is coated. The second metal film 93 becomes the second conductive layer 12 by removal of the extension portion 13 at the subsequent step. The material of the second metal film 93 may be, for example, a metal, such as Ni, Cr, Sn, Co, Fe, or Pd, or an alloy containing at least one kind of metal selected from these metals in the same way as the second conductive layer 12. In the present embodiment, the material of the second metal film 93 is Ni in the same way as the first metal film 91. The thickness of the second metal film 93 may be, for example, about 0.1 μm to about 1.0 μm. Preferably, the surface roughness Ra of the surface 93A (herein, upper surface and side surface) of the second metal film 93 falls within the range of 0.2 to 0.4 μm. This second metal film 93 may be formed by, for example, the same method as the first metal film 91.

As shown in FIG. 4B, through this step, the whole of the first surface 11A of the first conductive layer 11 is coated with the second conductive layer 12, and the whole of the side surface of the first conductive layer 11 is coated with the second conductive layer 12. At this time, roughening treatment, such as etching, is not applied to the first conductive layer 11, and therefore the first surface 11A and the side surface of the first conductive layer 11 are kept in a smooth state (low roughness state). For example, after the formation of the second metal film 93, the surface roughness Ra of the first surface 11A and the surface roughness Ra of the side surface of the first conductive layer 11 are maintained at a low value of less than 0.1 μm. As described above, at this step, the surface (herein, surface 93A) of a structure on the first-surface side (90A) of the support substrate 90 is formed to be a roughened surface while maintaining the first surface 11A and the side surface of the first conductive layer 11 as smooth surfaces.

Figure 4C:
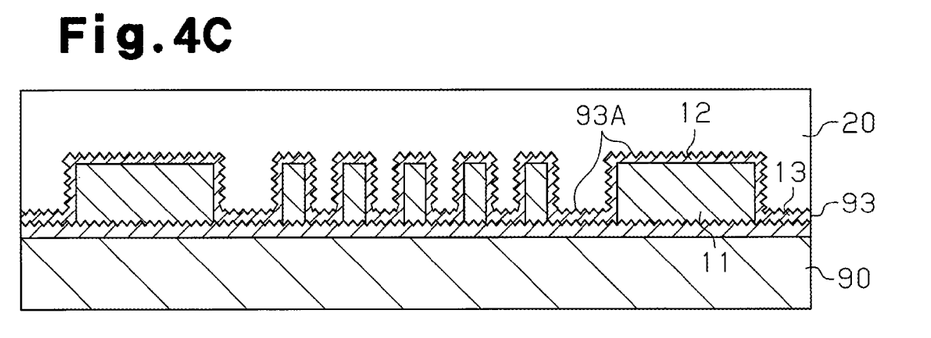

Thereafter, at the step of FIG. 4C, the first insulating layer 20 with which the whole of the surface 93A of the second metal film 93 is coated is formed on the surface 93A. At this time, the surface 93A of the second metal film 93 is a roughened surface, and therefore it is possible to obtain excellent adhesion between the second metal film 93 and the first insulating layer 20. The first insulating layer 20 may be formed, for example, by laminating a resin film to the second metal film 93 first and then heating and hardening the resin film at a temperature of about 130 to 150° C. while pressing the resin film.

Figure 4D:
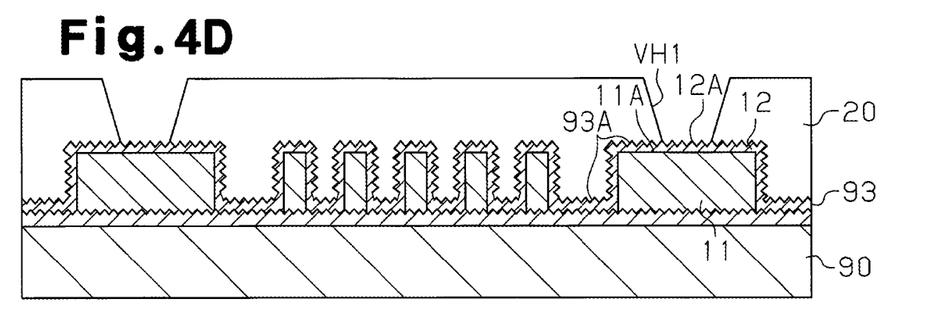

Thereafter, at the step of FIG. 4D, the via hole VH1 is formed at a predetermined place of the first insulating layer 20 so as to expose a part of the surface 93A of the second metal film 93 formed on the first surface 11A of the first conductive layer 11 (herein, part of the first surface 12A of the second conductive layer 12). This via hole VH1 may be formed by, for example, a laser processing method that uses a carbon dioxide gas laser or a UV-YAG laser. If the first insulating layer 20 is formed by use of photosensitive resin, a necessary via hole VH1 may be formed by, for example, a photolithography method.

Thereafter, if the via hole VH1 is formed by the laser processing method, desmearing is performed to remove resin residues (resin smears) of the first insulating layer 20 adhering to the first surface 12A of the second conductive layer 12 exposed to a bottom of the via hole VH1. According to this manufacturing method, when the via hole VH1 is formed by the laser processing method, the second conductive layer 12 that serves as the bottom of the via hole VH1 is an Ni layer that has a high laser-beam absorption rate, and therefore it is possible to make the amount of resin smears generated smaller than a via hole VH1 whose bottom is a Cu layer. As a result, it is possible to suitably remove the resin smears by performing the desmearing operation.

Figure 5A:
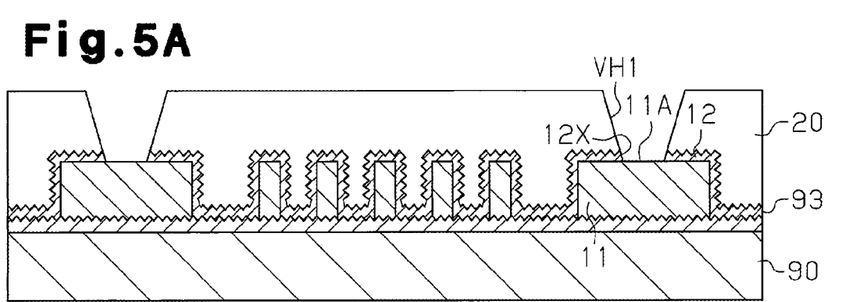
FIG. 5A, FIG. 5C, and FIG. 5D are schematic cross-sectional views to describe the manufacturing method of the wiring board of FIG. 1.

Thereafter, at the step of FIG. 5A, the opening portion 12X that passes through the second conductive layer 12 exposed to the via hole VH1 is formed so as to expose a part of the first surface 11A of the first conductive layer 11. This opening portion 12X is communicated with the via hole VH1. At this step, the second conductive layer 12 (Ni layer) exposed to the bottom of the via hole VH1 is removed by selectively etching. At this time, the first conductive layer 11 and the first insulating layer 20 function as etching-stopper layers, when the second conductive layer 12 (Ni) is etched. An etchant used at this time may be, for example, a nitric acid/hydrogen peroxide aqueous solution ($HNO_3/H_2O_2$) that is a mixed solution of a nitric acid and a hydrogen peroxide solution.

Figure 5B:
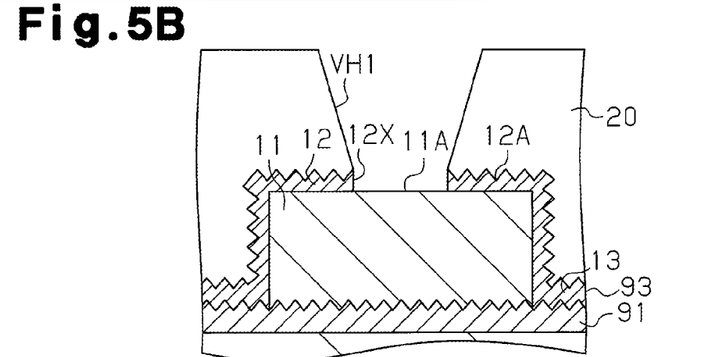
FIG. 5B is an enlarged cross-sectional view in which a part of a structure shown in FIG. 5A is modified.

At this step, the opening portion 12X is formed in a tapered shape in which its diameter becomes greater in proportion to an approach from the lower side (the first conductive layer side (11)) to the upper side as shown in FIG. 5A. In other words, the opening portion 12X is formed in a substantially inverted trapezoidal shape in cross sectional view. As shown in FIG. 5B, the opening portion 12X may be formed in a substantially rectangular shape (straight shape) in cross sectional view.

Through this step, the second conductive layer 12 exposed to the bottom of the via hole VH1 is selectively removed, and therefore it is possible to remove resin smears together with the second conductive layer 12 even if the resin smears remain on the first surface 12A of the second conductive layer 12. This makes it possible to expose the first surface 11A of the first conductive layer 11 having no residues, i.e., no resin smears to the bottom of the opening portion 12X.

Figure 5C:
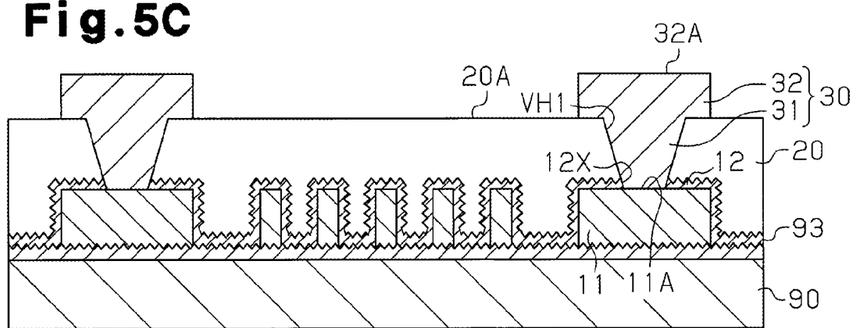

Thereafter, at the step of FIG. 5C, the via wiring 31 is formed by filling the via hole VH1 and the opening portion 12X with via conductors, and the wiring pattern 32 that is connected to the first conductive layer 11 (and the second conductive layer 12) through the via wiring 31 is formed on the first surface 20A of the first insulating layer 20. These via wiring and wiring pattern 31 and 32, i.e., the second wiring layer 30 may be formed by use of various wiring-forming methods, such as a semi-additive method and a subtractive method.

Figure 5D:
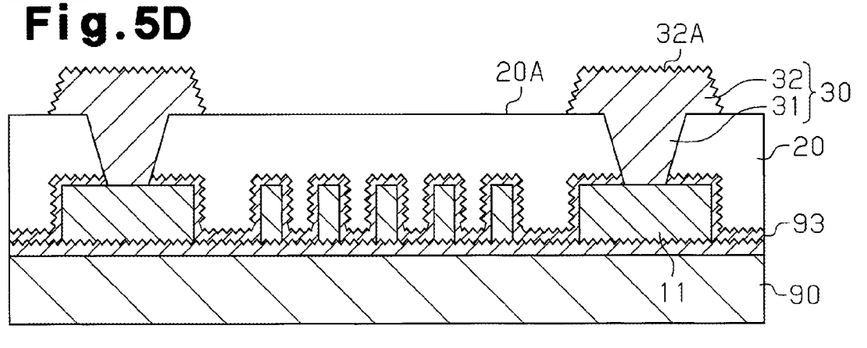

Thereafter, at the step of FIG. 5D, roughening treatment is applied to the surface (herein, the first surface 32A and the side surface of the wiring pattern 32) of the second wiring layer 30 exposed from the first insulating layer 20. This roughening treatment is performed so that the surface roughness Ra of the first surface 32A and the surface roughness Ra of the side surface of the wiring pattern 32 become, for example, 0.5 μm to 2.0 μm. This roughening treatment allows the first surface 32A and the side surface of the wiring pattern 32 to have fine rugged parts, and, as a result, the first surface 32A and the side surface are roughened. The roughening treatment may be performed by, for example, blackening, etching, plating, or sandblasting.

Figure 6A:
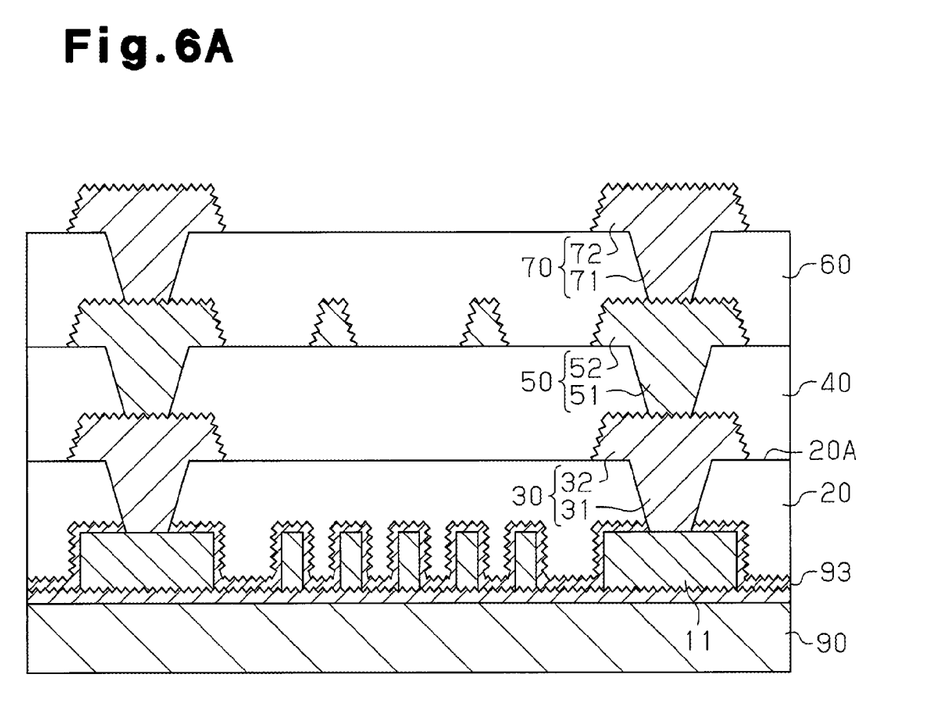
FIG. 6A and FIG. 6B are schematic cross-sectional views to describe the manufacturing method of the wiring board of FIG. 1.

Thereafter, the same steps as those of FIGS. 4C, 4D, 5C, and 5D are repeatedly performed at the step of FIG. 6A, and, as a result, the insulating layer 40, the wiring layer 50, the insulating layer 60, and the wiring layer 70 are alternately stacked on the first surface 20A of the first insulating layer 20.

Figure 6B:
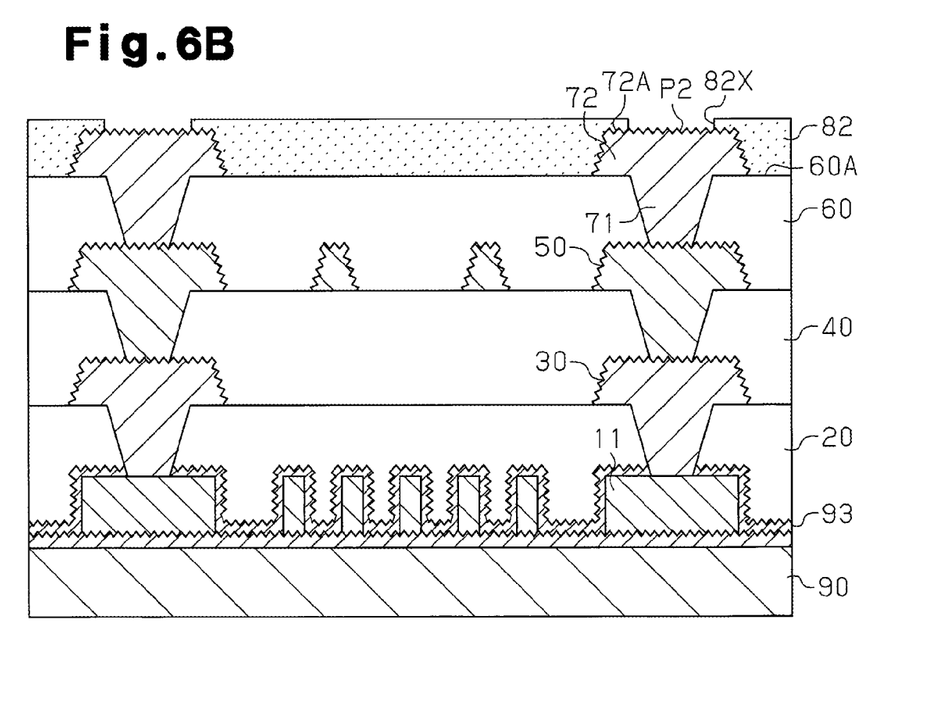

Thereafter, at the step of FIG. 6B, the solder resist layer 82, which has the opening portion 82X to expose the external connection pad P2 defined in a predetermined part of the wiring pattern 72 of the wiring layer 70, is stacked on the first surface 60A of the insulating layer 60. This solder resist layer 82 may be formed, for example, by laminating a photosensitive solder resist film or, alternatively, by applying a liquid solder resist, and by subjecting this resist to patterning so as to have a desired shape. As a result, a part of the wiring pattern 72 is exposed from the opening portion 82X of the solder resist layer 82 in the form of the external connection pad P2. If needed, a metallic layer made by, for example, stacking an Ni layer and an Au layer together in this order may be formed on the external connection pad P2. This metallic layer may be formed by, for example, an electroless plating method.

Figure 7A:
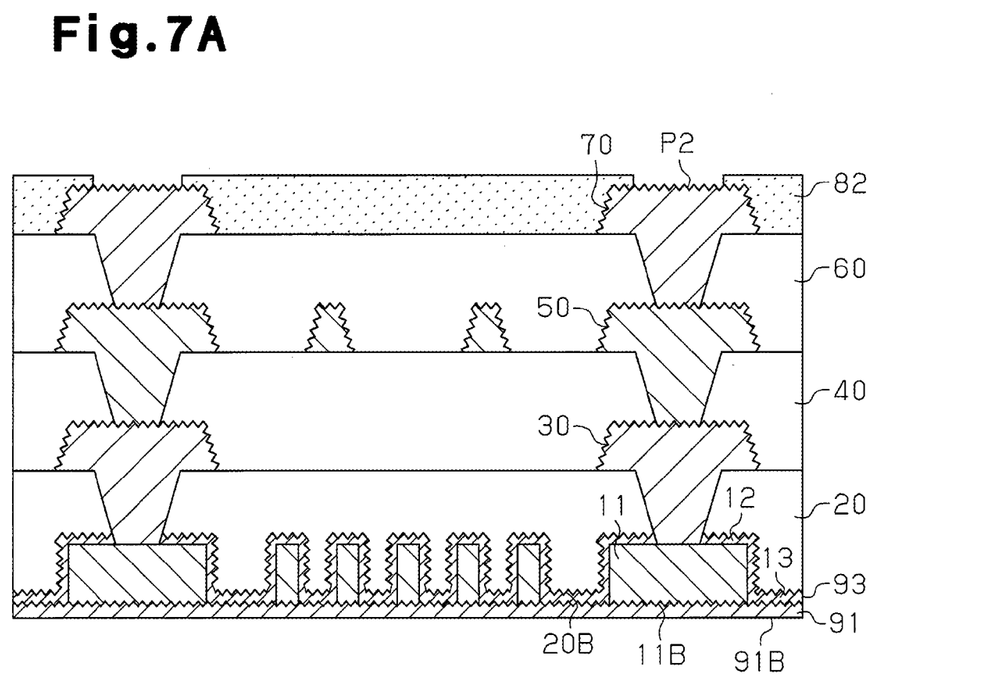
FIG. 7A and FIG. 7B are schematic cross-sectional views to describe the manufacturing method of the wiring board of FIG. 1.

Thereafter, at the step of FIG. 7A, the support substrate 90 (see FIG. 6B) is removed. For example, if a copper foil is used as the support substrate 90, it is removed by selectively etching by wet etching that uses a ferric chloride aqueous solution, a cupric chloride aqueous solution, or an ammonium persulfate aqueous solution. At this time, the first metal film 91 (Ni) functions as an etching-stopper layer when the support substrate 90 (Cu) is etched. It should be noted that, if the topmost layer of the wiring pattern 72 is a copper layer, there is a need to perform wet etching while masking the wiring pattern 72 in order to prevent the wiring pattern 72 from being etched along with the support substrate 90.

Thereafter, the first metal film 91 is removed, and a part of the second metal film 93, i.e., the extension portion 13 is removed. At this step, the first metal film 91 and the extension portion 13 are removed by selectively etching. At this time, the first conductive layer 11 (Cu layer) and the first insulating layer 20 (resin layer) function as etching stopper layers, when the first metal film 91 (Ni layer) and the extension portion 13 (Ni layer) are etched. In this case, the etchant may be, for example, a nitric acid/hydrogen peroxide aqueous solution.

Figure 7B:
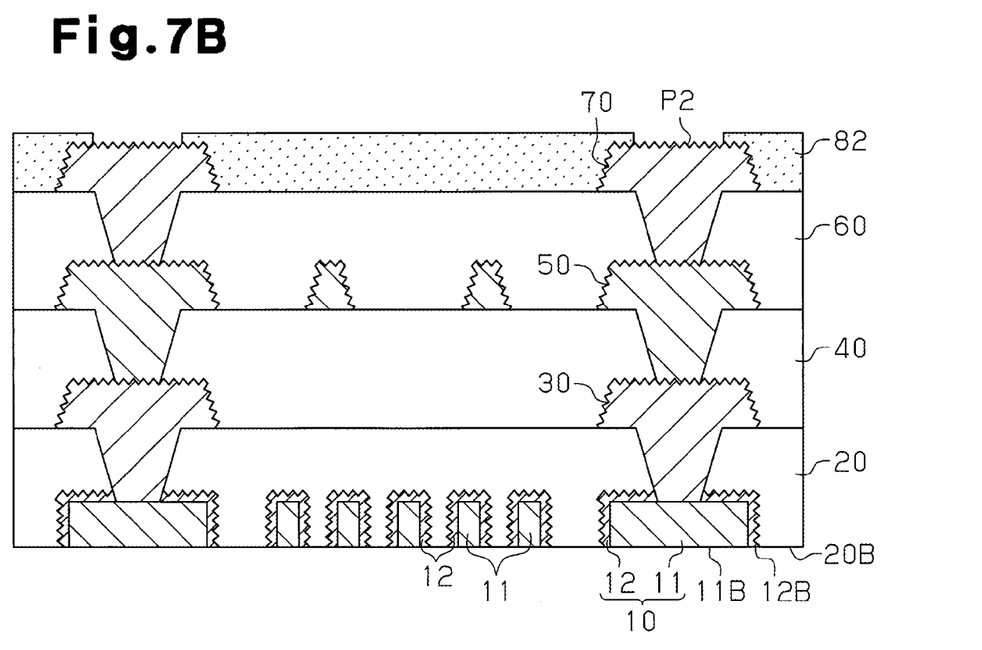

Thereafter, surface treatment, such as flattening treatment, is applied onto the second surface 11B of the first conductive layer 11 and onto the second surface 20B of the first insulating layer 20, and, as a result, a structure shown in FIG. 7B may be obtained. In other words, the adjacent second conductive layers 12 are separated from each other, and, as a result, it is possible to obtain a structure in which the second surface 11B of the first conductive layer 11, the second surface 12B of the second conductive layer 12, and the second surface 20B of the first insulating layer 20 are substantially flush with each other.

Figure 8A:
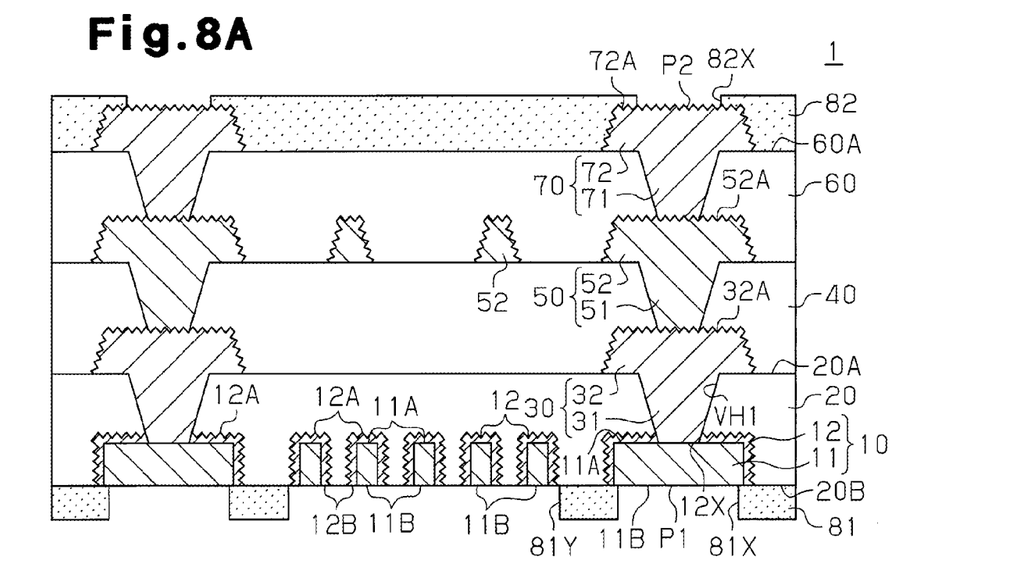
FIG. 8A is a schematic cross-sectional view to describe the manufacturing method of the wiring board of FIG. 1.

Thereafter, at the step of FIG. 8A, the solder resist layer 81, which has the opening portion 81X to expose the pad P1 defined at a predetermined place of some wiring layers 10 and the opening portion 81Y to expose some wiring layers 10 and a part of the second surface 20B of the first insulating layer 20, is stacked on the second surface 20B of the first insulating layer 20. This solder resist layer 81 may be formed, for example, by laminating a photosensitive solder resist film or, alternatively, by applying a liquid solder resist, and by subjecting this resist to patterning so as to have a desired shape. As a result, a part of the wiring layer 10 is exposed from the opening portion 81X of the solder resist layer 81 in the form of the pad P1. If needed, a metallic layer made by, for example, stacking an Ni layer and an Au layer together in this order may be formed on the pad P1. This metallic layer may be formed by, for example, an electroless plating method.

Through these manufacturing steps, the wiring board 1 of the present embodiment may be manufactured.

Figure 8B:
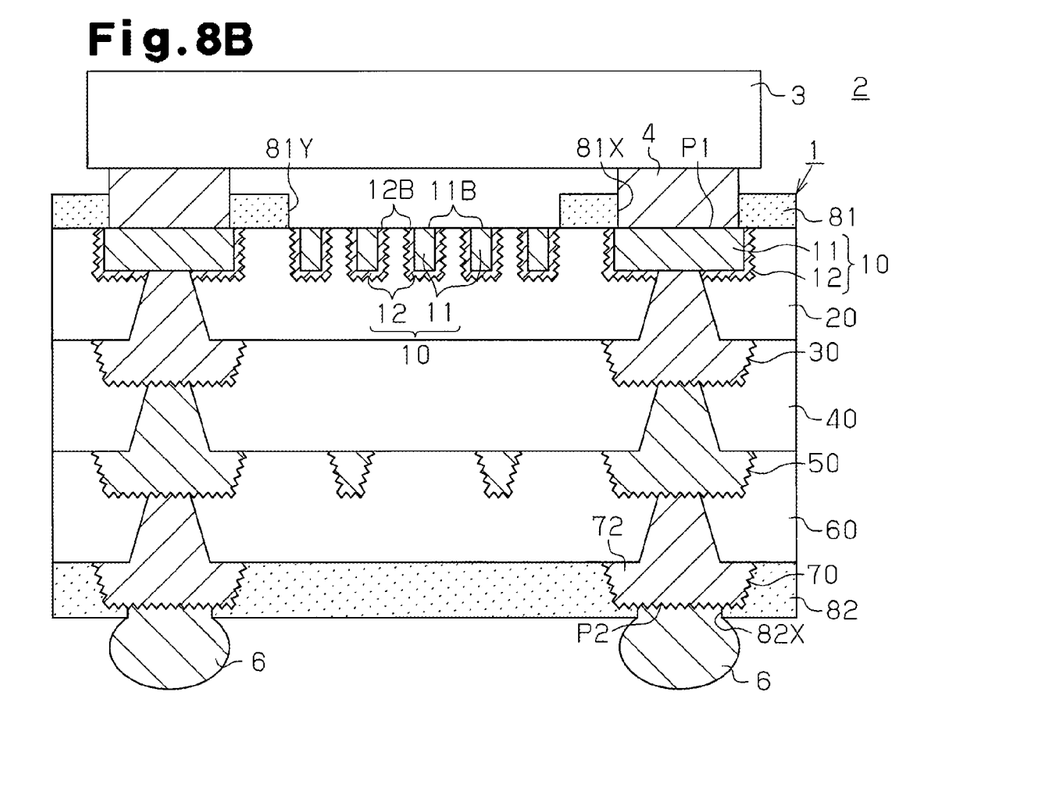
FIG. 8B is a schematic cross-sectional view to describe the manufacturing method of the semiconductor device of FIG. 1.

Next, a manufacturing method of the semiconductor device 2 will be described with reference to FIG. 8B. In FIG. 8B, the wiring board 1 is depicted so as to reverse the top and bottom of the wiring board 1 of FIG. 8A.

At the step of FIG. 8B, the external connection terminal 6 is formed on the external connection pad P2. For example, flux is appropriately applied onto the external connection pad P2, and then the external connection terminal 6 (herein, solder ball) is mounted thereon, and is fixed while reflowing at a temperature of about 240 to 260° C. Thereafter, the surface is cleaned to remove the flux.

At the step of FIG. 8B, the semiconductor chip 3 is mounted on the wiring board 1. More specifically, the bump 4 of the semiconductor chip 3 is bonded to the pad P1 of the wiring board 1 according to a flip-chip method. Thereafter, a space between the semiconductor chip 3 and the wiring board 1 that have undergone flip-chip bonding is filled with the underfill resin 5 (see FIG. 2), and this underfill resin 5 is hardened.

Through these manufacturing steps, the semiconductor device 2 shown in FIG. 2 may be manufactured.

According to the present embodiment, the following effects are obtained.

(1) The outermost wiring layer 10 and the outermost first insulating layer 20 are formed. The outermost wiring layer 10 includes the first conductive layer 11 and the second conductive layer 12 with which the first surface 11A and the side surface of the first conductive layer 11 are coated and that has the first surface 12A and its side surface both of which are roughened-surfaces. The first surface 12A and the side surface of the second conductive layer 12 are coated with the outermost first insulating layer 20. As a result, it is possible to satisfactorily secure an adhesive force with the first insulating layer 20 by means of the second conductive layer 12 having the first surface 12A and its side surface that are roughened-surfaces even if the first surface 11A and the side surface of the first conductive layer 11 are smooth surfaces. There is no need to apply roughening treatment onto the first surface 11A and the side surface of the first conductive layer 11. Therefore it is possible to suitably restrain the first conductive layer 11 from becoming small in width and from becoming small in thickness. As a result, the width of the first conductive layer 11 is not required to be made greater than a design value (the thickness thereof is not required to be made greater than a design value) in consideration of the extent to which the first conductive layer 11 is diminished (thinned) by roughening treatment. As a result, for example, it becomes unnecessary to make the width of the resist layer 92 unnecessarily small, and therefore problems, such as fall-down of the resist layer 92, may be suitably prevented from occurring. Even if the wiring layer 10 is reduced in size, the problem of fall-down of the resist layer 92 is prevented from occurring, and therefore it is possible to easily deal with the reduction of the wiring layer 10 in size.

(2) There is no need to apply roughening treatment onto the first surface 11A and the side surface of the first conductive layer 11, and therefore it is possible to easily form the first conductive layer 11 into a desired structure (e.g., a cross-sectional structure). As a result, it is possible to easily secure a desired cross-sectional area with respect to the first conductive layer 11, and therefore it is possible to easily perform impedance control.

(3) The first conductive layer 11 is coated with the second conductive layer 12 having a higher resistivity than the first conductive layer 11. Additionally, the first surface 11A and the side surface of the first conductive layer 11 are each formed to be a smooth surface. In other words, there is no need to apply roughening treatment onto the first surface 11A and the side surface of the first conductive layer 11 as described above, and therefore it is possible to keep the first surface 11A and the side surface of the first conductive layer 11 as smooth surfaces. As a result, it is possible to bring the transmission characteristic of a high frequency signal into a more excellent state than when the first surface 11A and the side surface of the first conductive layer 11 are each formed to be a roughened surface.

(4) As described above, the via hole VH1 that reaches the first surface 12A of the second conductive layer 12 is formed in the first insulating layer 20. As a result, when the via hole VH1 is formed by the laser processing method, the second conductive layer 12 serving as the bottom of the via hole VH1 becomes an Ni layer having a high laser-beam absorption rate, and therefore it is possible to make the amount of resin smears generated in the bottom smaller than a via hole VH1 whose bottom is a Cu layer.

(5) The opening portion 12X that is communicated with the via hole VH1 and that reaches the first surface 11A of the first conductive layer 11 is formed in the second conductive layer 12. In other words, the second conductive layer 12 exposed to the bottom of the via hole VH1 is selectively removed. As a result, even if resin smears remain on the first surface 12A of the second conductive layer 12 exposed to the bottom of the via hole VH1, it is possible to remove the resin smears together with the second conductive layer 12. It is possible to expose the first surface 11A of the first conductive layer 11 having no residues of resin smears to the bottom of the opening portion 12X. Additionally, the via wiring 31 is formed such that the opening portion 12X and the via hole VH1 are filled with the via wiring 31, and therefore it is possible to improve the reliability of a connection between the via wiring 31 and the first conductive layer 11 (wiring layer 10).

(6) The first metal film 91 having the first surface 91A that is a roughened surface is formed on the support substrate 90, and the first insulating layer 20 is formed on the first surface 91A of the first metal film 91. As a result, it is possible to make adhesion between the support substrate 90 (first metal film 91) and the first insulating layer 20 greater than when the first insulating layer 20 is formed on the first surface 90A of the support substrate 90 that is a smooth surface. It is possible to restrain the occurrence of problems such as peeling-off of the first insulating layer 20 from the support substrate 90 during a manufacturing operation.

The aforementioned embodiment may be modified as follows, for example.

The via wiring 31 is not necessarily required to fill the via hole VH1 and the opening portion 12X. For example, the via wiring 31 may be a conformal via. No specific limitations are imposed on the shape of the via wiring 31 if the via wiring 31 coats the inner surface of the via hole VH1 and the inner surface of the opening portion 12X and if the via wiring 31 electrically connects the wiring layer 10 and the wiring pattern 32 together between which the first insulating layer 20 is sandwiched. The same applies to the via wiring lines 51 and 71.

The opening portion 12X may be excluded. In other words, the second conductive layer 12 may be formed so as to coat the whole of the first surface 11A of the first conductive layer 11. In this case, the via wiring 31 is connected to the first surface 12A of the second conductive layer 12.

The second conductive layer 12 having a rough surface may be formed by methods other than the electrolytic plating method. For example, a second conductive layer 12 having a smooth first surface 12A and its smooth side surface may be formed, and then the second conductive layer 12 having rough surfaces may be formed by applying roughening treatment, such as etching, onto the first surface 12A and its side surface.

In the aforementioned embodiment, the first surfaces 32A, 52A, 72A and the side surfaces of the wiring patterns 32, 52, and 72 are each formed to be a roughened surface, and yet the present invention is not limited to this. For example, the first surfaces 32A, 52A, 72A and the side surfaces of the wiring patterns 32, 52, and 72 may be each formed to be a smooth surface. In other words, roughening treatment may be excluded with respect to the first surfaces 32A, 52A, 72A and the side surfaces of the wiring patterns 32, 52, and 72.

In the aforementioned embodiment, the second metal film 93 is formed with which the first surface 11A and the side surface of the first conductive layer 11 are coated and with which the first surface 91A of the first metal film 91 exposed from the first conductive layer 11 is coated. In other words, the second metal film 93 is formed that has the second conductive layer 12 with which the first surface 11A and the side surface of the first conductive layer 11 are coated and the extension portion 13 with which the first surface 91A of the first metal film 91 exposed from the first conductive layer 11 is coated. However, without being limited to this, for example, another second metal film 93 may be formed that does not have the extension portion 13, i.e., another second metal film 93 may be formed with which only the first surface 11A and the side surface of the first conductive layer 11 are coated.

In the aforementioned embodiment, the first metal film 91 is formed so as to coat the whole of the first surface 90A of the support substrate 90. However, without being limited to this, for example, the first metal film 91 may be formed only between the first conductive layer 11 and the first surface 90A of the support substrate 90. For example, a resist layer is formed on the first surface 90A of the support substrate 90, and the first metal film 91 and the first conductive layer 11 are stacked, in this order, on the support substrate 90 exposed from an opening portion of the resist layer. Thereafter, the resist layer is removed, and the second metal film 93 is formed that includes the second conductive layer 12 with which the first surface 11A and the side surface of the first conductive layer 11 are coated.

The formation of the first metal film 91 may be excluded.

The whole of the second surface 11B of the first conductive layer 11 may be exposed from the opening portion 81X of the solder resist layer 81 in the form of the pad P1. The whole of the second surface 11B of the first conductive layer 11 and the whole of the second surface 12B of the second conductive layer 12 may be exposed from the opening portion 81X of the solder resist layer 81 in the form of the pad P1.

The solder resist layer 81 may be excluded.

The solder resist layer 82 may be excluded.

The second conductive layer 12 may be formed to have a structure in which two or more metal films are stacked together. Preferably, in this case, a metal, such as Ni, Cr, Sn, Co, Fe, or Pd, or an alloy containing at least one kind of metal selected from these metals is used as the material of an outermost metal film farthest from the first conductive layer 11.

In the aforementioned embodiment, the present invention is embodied in the manufacturing method for a single piece, and yet it may be embodied in the manufacturing method for multiple pieces.

The number of wiring layers 10, 30, 50, and 70, the number of first insulating layers 20, 40, and 60, and the installation of wiring lines, etc., may be variously changed in the wiring board 1 of the aforementioned embodiment.

In the aforementioned embodiment, the semiconductor chip 3 is mounted on the wiring board 1, and yet an object to be mounted is not limited to the semiconductor chip 3. For example, the present invention may be applied to a package (Package-on-Package) that has a structure in which another wiring board is piled on the wiring board 1.

The number of semiconductor chips mounted on the wiring board 1 or the mode of mounting the semiconductor chip (e.g., flip-chip mounting, wire bonding mounting, or a combination of these mounting modes), etc., may be changed variously.

This disclosure further encompasses various embodiments described below.

[Clause 1] According to an embodiment, a method of manufacturing a wiring board includes: forming a first conductive layer made of a first conductive material on a first surface of a support substrate; forming a second conductive layer made of a second conductive material differing from the first conductive material of the first conductive layer, the second conductive layer coating the first surface and a side surface of the first conductive layer, the second conductive layer including a first surface and a side surface, each having surface roughness higher than those of the first surface and the side surface of the first conductive layer; forming a first insulating layer on the first surface of the support substrate, the first insulating layer being an outermost layer and coating the first surface and the side surface of the second conductive layer; forming a via wiring and a wiring pattern, the via wiring passing through the first insulating layer, the wiring pattern being stacked on the first insulating layer, the wiring pattern being electrically connected to a first wiring layer including the first conductive layer and the second conductive layer through the via wiring; and removing the support substrate.

[Clause 2] In the method of manufacturing a wiring board according to clause 1, it is preferable that the forming the via wiring and the wiring pattern includes: forming a via hole that passes through the first insulating layer and exposes the first surface of the second conductive layer; forming an opening portion in the second conductive layer, the opening portion being communicated with the via hole and partially exposing the first surface of the first conductive layer; and forming the via wiring in the via hole and in the opening portion and stacking the wiring pattern on the first insulating layer, the wiring pattern being connected to the first conductive layer through the via wiring.

[Clause 3] In the method of manufacturing a wiring board according to clause 2, it is preferable that the forming the opening portion includes selectively etching the second conductive layer that is exposed from the via hole from the first conductive layer and the first insulating layer.

[Clause 4] It is preferable that the method of manufacturing a wiring board according to clause 1, further includes: forming a first metal film on the first surface of the support substrate prior to the forming the first conductive layer; and removing the first metal film subsequent to the removing the support substrate; the first metal film being made of a conductive material different from a conductive material of the first conductive layer and from a conductive material of the support substrate, the first metal film having a first surface higher in roughness than the first surface of the support substrate; wherein the first conductive layer and the first insulating layer are formed on the first surface of the first metal film.

[Clause 5] In the method of manufacturing a wiring board according to clause 4, it is preferable that the forming the second conductive layer includes forming a second metal film, the second metal film including the second conductive layer and an extension portion, the extension portion extending from the second conductive layer and connecting an adjacent second conductive layer thereto, the extension portion coating the first surface of the first metal film, and that the removing the first metal film includes removing the first metal film and the extension portion.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although embodiments of the present invention have been described in detail, it should be understood that various changes, substitutions, and alterations could be made hereto without departing from the spirit and scope of the invention.

What is claimed is:

1. A wiring board comprising:
   a first wiring layer that includes a first conductive layer and a second conductive layer, the second conductive layer coating a first surface of the first conductive layer and a side surface of the first conductive layer, the first conductive layer and the second conductive layer being respectively made of a first conductive material and a second conductive material differing from the first conductive material;
   a first insulating layer that is an outermost layer of the wiring board, the first insulating layer coating a first surface of the second conductive layer and a side surface of the second conductive layer so as to expose a second surface of the first conductive layer which is opposite to the first surface of the first conductive layer;
   a second wiring layer that is stacked on a first surface of the first insulating layer and that is electrically connected to the first wiring layer; and
   the first surface and the side surface of the first conductive layer being smooth surfaces while the first surface and the side surface of the second conductive layer being roughened-surfaces, wherein
   the first insulating layer includes a via hole,
   the second conductive layer includes an opening portion configured to partially expose the first surface of the first conductive layer, the opening portion being communicated with the via hole, and
   the second wiring layer includes:
      a via wiring formed in the via hole and in the opening portion; and
      a wiring pattern stacked on the first surface of the first insulating layer and connected to the first wiring layer through the via wiring.

2. The wiring board according to claim 1, wherein the via hole is shaped to have a trapezoidal shape in cross sectional view, and the opening portion is shaped to have a rectangular shape or a trapezoidal shape in cross sectional view.

3. The wiring board according to claim 1, wherein a surface of the wiring pattern exposed from the first insulating layer has surface roughness higher than those of the first surface and the side surface of the first conductive layer.

4. The wiring board according to claim 1, wherein the first surface and the side surface of the first conductive layer each have a surface roughness Ra less than 0.1 μm, and the first surface and the side surface of the second conductive layer each have a surface roughness Ra between 0.2 μm and 0.4 μm.

5. The wiring board according to claim 1, wherein the second conductive layer is a coating film that protects the first conductive layer from being etched and enhances bonding strength between the first conductive layer and the first insulating layer.

6. The wiring board according to claim 1, wherein the first material of the first conductive layer is selected from the group consisting of copper and a copper alloy while the second material of the second conductive layer is selected from the group consisting of nickel, chromium, tin, cobalt, iron, palladium, and mixtures thereof.

* * * * *